United States Patent [19]

Wu

[11] Patent Number: 5,736,446

[45] Date of Patent: Apr. 7, 1998

[54] METHOD OF FABRICATING A MOS DEVICE HAVING A GATE-SIDE AIR-GAP STRUCTURE

[75] Inventor: Shye-Lin Wu, Hsinchu Hsien, Taiwan

[73] Assignee: Powerchip Semiconductor Corp., Hsin-Chu, Taiwan

[21] Appl. No.: 859,753

[22] Filed: May 21, 1997

[51] Int. Cl.$^6$ ............................................. H01L 21/8234
[52] U.S. Cl. ........................... 438/305; 438/773; 438/960
[58] Field of Search ..................................... 438/301, 303, 438/305, 773, 960

[56] References Cited

U.S. PATENT DOCUMENTS

| | | | |
|---|---|---|---|
| 5,102,815 | 4/1992 | Sanchez | 438/305 |
| 5,171,700 | 12/1992 | Zamanian | 438/305 |
| 5,183,771 | 2/1993 | Mitsui et al. | 438/305 |
| 5,364,807 | 11/1994 | Hwang | 438/305 |
| 5,547,885 | 8/1996 | Ogoh | 438/305 |
| 5,595,919 | 1/1997 | Pan | 438/305 |
| 5,641,698 | 6/1997 | Lin | 438/305 |

OTHER PUBLICATIONS

"A Self–Aligned Counter Well–Doping Technology Utilizing Channeling Ion Implantation and Its Application to 0.25 µm CMOS Process" H. Nakamura et al., Symp. on VLSI Tech. Dig., p. 67, 1995.

Primary Examiner—John Niebling
Assistant Examiner—Richard A. Booth
Attorney, Agent, or Firm—Ladas & Parry

[57] ABSTRACT

A method of fabricating a MOS device having a gate-side air-gap structure is provided. A nitride spacer for reserving space of the air gap is formed on the substrate adjacent to the gate structure. An amorphous silicon spacer for forming the sidewall spacer and sealing the air gap is formed adjacent to the nitride spacer. The upper portion of the amorphous silicon spacer is heavily doped during the source/drain implantation. After removing the nitride spacer the doped amorphous silicon spacer is oxidized by a wet oxidation process to form a doped oxide spacer. The growing doped oxide spacer will seal the hole for the nitride spacer resulting from the heavily doped upper portion having a higher oxidation rate than that of other portions. Dopants implanted in the amorphous silicon spacer migrate into the substrate and extended ultra-shallow doped regions are formed that reduce the series resistance of the LDD structure.

14 Claims, 3 Drawing Sheets

METHOD OF FABRICATING A MOS DEVICE HAVING A GATE-SIDE AIR-GAP STRUCTURE

BACKGROUND OF THE INVENTION

1. Field of the Invention

The present invention in general relates to a semiconductor process, and more specifically, to a method of fabricating a MOS (metal-oxide-semiconductor) device having a gate-side air-gap structure which has a lower fringing field capacitance ($C_{FR}$) so as to improve the gate delay time and power consumption of the MOS device.

2. Description of the Prior Art

As device dimensions continue to shrink, parasitic effects of MOS devices have become a critical factor in device performance and circuit integrity. Most of the parasitic effects, such as parasitic capacitance, impact the device characteristics during the period of normal operation, and, therefore, should be minimized. Various types of device structures and fabrication processes have been proposed to solve these problems.

In typical MOS devices there are four types of parasitic capacitance that have been modeled and analyzed. They are: (1) gate capacitance $C_G$, which indicates capacitance of the polysilicon/oxide/substrate structure; (2) gate-to-drain capacitance $C_{OV}$, which indicates capacitance due to overlap of the gate and the source/drain; (3) junction capacitance $C_J$, which indicates capacitance due to charge-storing effects; and (4) gate fringing field capacitance $C_{FR}$. Usually, gate capacitance $C_G$ is important to device current drivability and can not be reduced. Capacitances $C_{OV}$ and $C_J$ can be reduced by adjusting the sidewall spacer thickness, by implanting a channel impurity locally around the gate electrode or other techniques. However, capacitance $C_{FR}$ is difficult to reduce and will cause a significant gate delay time.

For example, a self-aligned counter well-doping technology was disclosed in the article entitled "A Self-aligned Counter Well-Doping Technology Utilizing Channeling Ion Implantation and Its Application to 0.25 µm CMOS Process," H. Nakamura et al., Symp. on VLSI Tech. Dig., p67, 1995, the disclosure of which provides for reducing parasitic capacitance. In addition, a gate-side air-gap structure was disclosed in the article entitled "A Gate-side Air-gate Structure (GAS) to Reduce the Parasitic Capacitance in MOSFETs," M. Togo et al., Symp. on VLSI Tech. Dig., p.38, 1996, the disclosure of which claims that a gate-side air-gap structure can reduce the fringing field capacitance.

On the other hand, the LDD (lightly doped drain) structure that is used in MOS devices to prevent hot-carrier effects has become popular in integrated circuits. The LDD structure includes a lightly doped region and a heavily doped region for a drain or source of the MOS device. However, discontinuous doping concentration between the heavily doped and lightly doped regions may induce severe series resistance problems.

SUMMARY OF THE INVENTION

An object of the present invention is to provide a novel method of fabricating MOS devices having a gate-side air-gap structure which can reduce fringing field capacitance of MOS devices.

Another object of the present invention is to provide a method of fabricating MOS devices which has less series resistance in the LDD structure.

The present invention achieves the above-indicated objectives by providing a method of fabricating MOS devices having a gate-side air-gap structure. According to the method, the initial step is to pattern a polysilicon gate on a semiconductor substrate. This polysilicon gate has a stacked structure including a gate polysilicon layer and a gate oxide layer as in the conventional process. Then, the surface of the exposed substrate and the polysilicon gate may be optionally oxidized in an $N_2O$ gas ambient to recover damages caused by the gate-patterning step.

The following steps are implemented to form the LDD structure of the MOS device. First, an ion implantation with a light dosage is applied to the substrate to form a lightly doped source region and a lightly doped drain region embedded in the substrate. Then two spacers, including a nitride spacer and an amorphous silicon spacer are formed adjacent to the gate structure on the substrate in the next step. The nitride spacer is used to reserve space for the air gap within the sidewall spacer formed later, while the amorphous silicon spacer is used to form the sidewall spacer and seal the air gap. Heavily doped source/drain regions are formed by an ion implantation with a heavier dosage and an annealing process. At this time, the upper portion of the amorphous silicon spacer is heavily doped. After removing the nitride spacer and applying a halo implantation to form halo regions beneath the lightly doped source and drain regions, the doped amorphous silicon spacer is oxidized by a wet oxidation process to form a doped oxide spacer with an air gap and extended doped regions embedded in the substrate beneath the doped oxide spacer.

Various other objects, advantages and features of the present invention will become readily apparent from the ensuring detailed description, and the novel features will be particularly pointed out in the appended claims.

BRIEF DESCRIPTION OF THE DRAWINGS

The following detailed description, given by way of example and not intended to limit the invention solely to the embodiment described herein, will best be understood in conjunction with the accompanying drawings, in which.

DETAILED DESCRIPTION OF THE PREFERRED EMBODIMENTS

Referring to FIGS. 1 to 8, a method of fabricating a MOS device having a gate-side air-gap structure on substrate 10 in accordance with the present invention is provided. Field oxide 12 is formed on substrate 10 by the conventional LOCOS process to isolate active regions on substrate 10. In this embodiment described below an NMOS device is formed on substrate 10 that is lightly doped with P-type impurities, such as boron. However, it is understood by those skilled in the art that PMOS devices can be fabricated in a similar manner.

Having the conventional formation in place, the manufacturing process of the present invention includes the following steps:

Step 1

Figure 1:
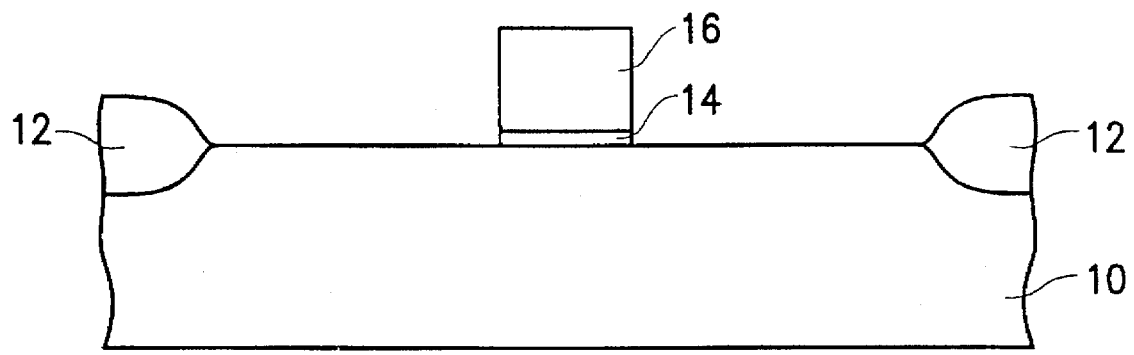
FIG. 1 to FIG. 8 are cross-sectional views that illustrate the fabrication process of the preferred embodiment in accordance with the present invention.
Figure 2:
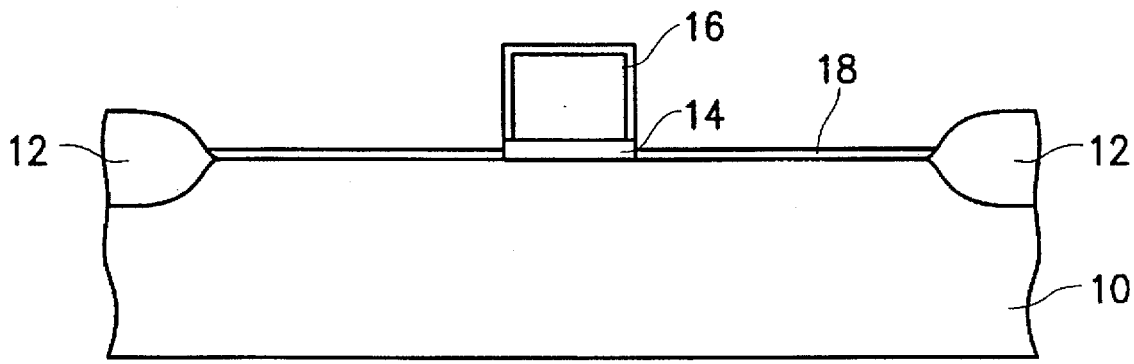

Referring to FIG. 1 and FIG. 2, the first step of this embodiment is to fabricate a gate structure which includes a gate oxide and a gate polysilicon. In FIG. 1, MOS gate structure including gate oxide 14 and gate polysilicon 16 is formed on substrate 10. Gate oxide 14 is a very thin oxide layer, about 2–15 nm, without contamination and usually is grown with care by a dry oxidation process in a chlorine (Cl$_2$) ambient environment. Gate polysilicon 16 has a thickness of about between 0.4 μm–0.5 μm and is usually grown by CVD (chemical vapor deposition) or other deposition techniques. The stacked layer of gate oxide 14 and gate polysilicon 16 is then patterned by a photolithography (gate mask) and etching process to form the gate structure shown in FIG. 1.

It should be noted that some wafer surface defects may be caused by the etching process during the period of patterning the gate structure. Accordingly, the surface of exposed substrate 10 and polysilicon gate 16 can be oxidized in N$_2$O gas ambient environment to recover damages caused by the gate-patterning step. At this time, oxynitride layer 18 is formed on exposed substrate 10 and gate polysilicon 16, as shown in FIG. 2. It should be noted that the reoxidation process shown in FIG. 2 is an optional step. It is understood by those skilled in the art that other curing methods or prevention steps can be applied to protect the substrate from etching damages.

Step 2

Figure 3:
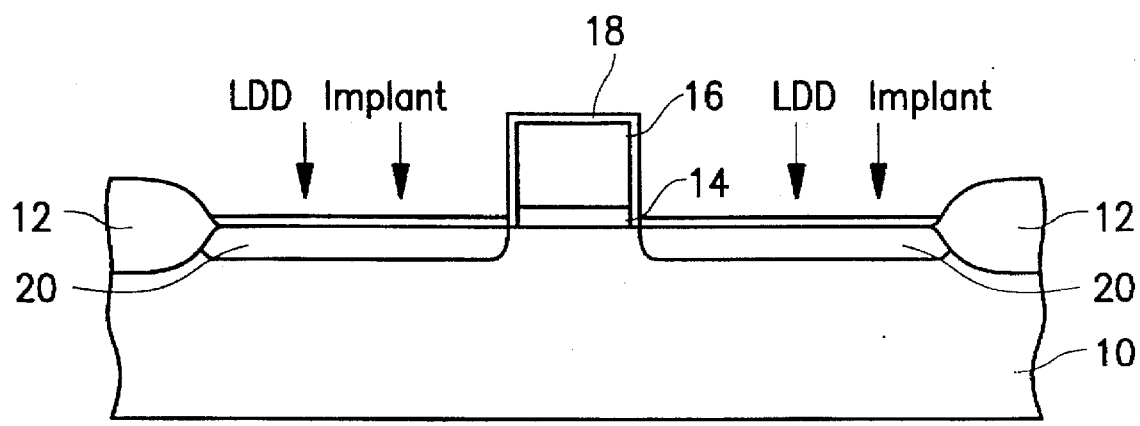

Referring to FIG. 3, the second step of this embodiment is to form lightly doped regions of a LDD structure. By using the gate polysilicon as a mask, a LDD (Lightly Doped Drain) implant is applied on substrate 10 to form lightly doped source/drain regions 20 which are embedded in substrate 10 on opposite sides of the gate structure. For NMOS devices, the LDD implant uses phosphorus (P) or arsenic (As) as dopants with a dosage of between $5\times10^{12}$ and $1\times10^{14}$ atoms/cm$^2$ and an energy of between 10 KeV and 60 KeV. On the other hand, it is understood by those skilled in the art that BF$_2$ or B can be employed as dopants for PMOS devices.

Step 3

Figure 4:
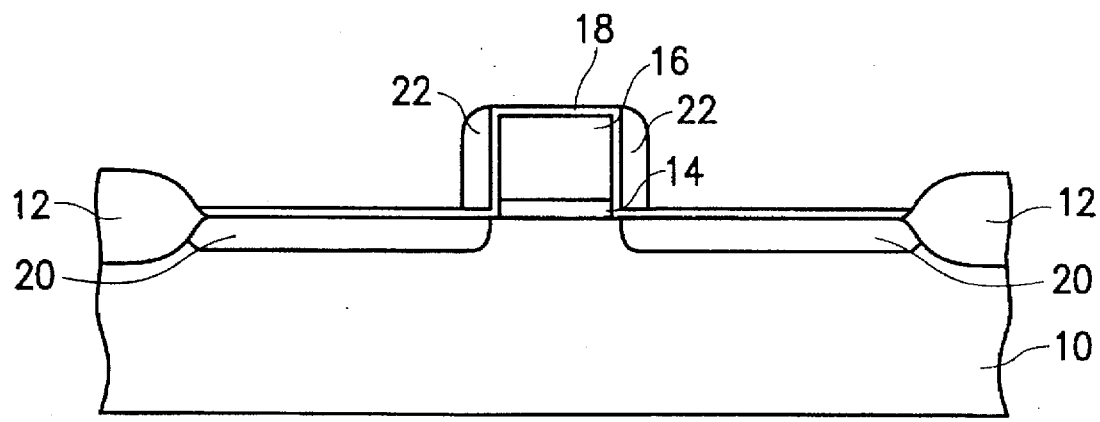

Referring to FIG. 4, the third step of this embodiment is to form a nitride spacer adjacent to the gate structure on substrate 10. First, a nitride layer having a thickness of between 200 Å and 1000 Å is deposited on substrate 10 and the gate structure, or alternatively on oxynitride layer 18 when this optional layer is used. Then, the nitride layer is anisotropically etched by a dry etching process, for example, CF$_4$ plasma, to form nitride spacer 22. It should be noted that the conventional sidewall spacers are usually made of oxide, not nitride. Nitride spacer 22 is used to reserve space for air gaps and will be removed subsequently Step 4

Figure 5:
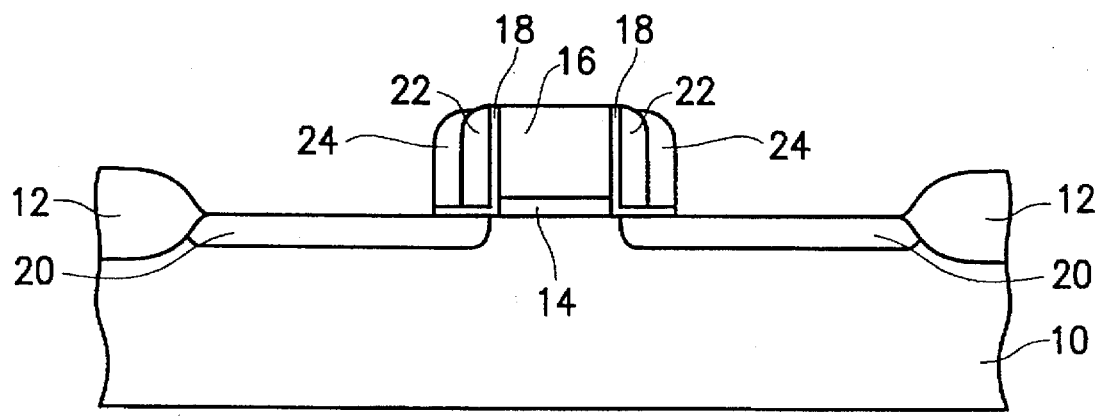

Referring to FIG. 5, the fourth step of this embodiment is to further form an amorphous silicon spacer 24 adjacent to nitride spacer 22 on substrate 10. The fabrication process of amorphous silicon spacer 24 is similar to that of nitride spacer 22. First, an amorphous silicon layer having a thickness of between 200 Å and 1000 Å is deposited on substrate 10, nitride spacer 22 and the gate structure. Then, the amorphous silicon layer is anisotropically etched by a dry etching process to form amorphous silicon spacer 24. The purpose of amorphous silicon spacer 24 is to form the "real" sidewall spacer, compared with the "dummy" nitride spacer.

Step 5

Figure 6:
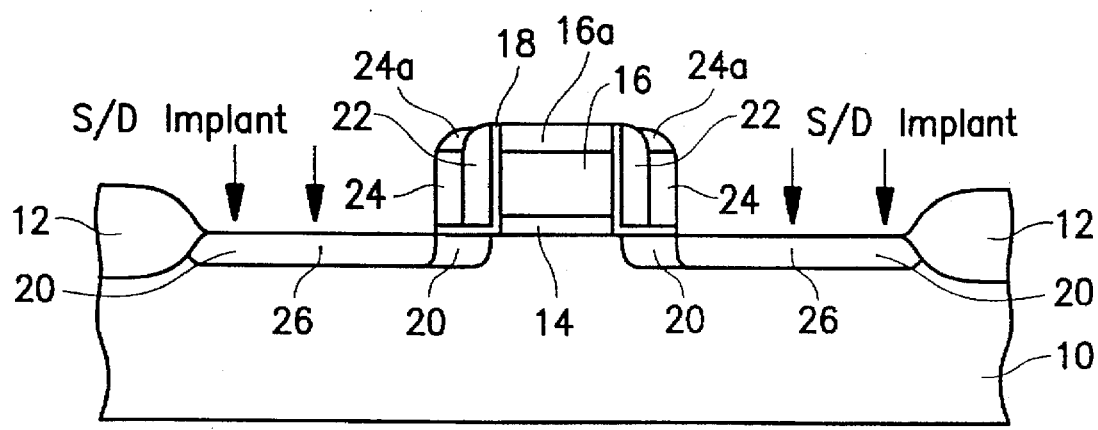

Referring to FIG. 6, the fifth step of this embodiment is to form heavily doped regions of the LDD structure, source and drain regions. As shown in FIG. 6, a source/drain implant is applied to gate polysilicon 16, amorphous silicon spacer 24 and substrate 10. For an NMOS device version of this embodiment, the source/drain implant uses arsenic as dopants, with a dosage of between $2\times10^{15}$ and $2\times10^{16}$ atoms/cm$^2$ and an energy of between 10 KeV and 60 KeV. Usually, the source/drain implantation has a higher implant dosage than that of the LDD implantation and is followed by a short thermal process, which slightly anneals the doped surface of substrate 10, and, thus, the dopants are driven-in to form heavily doped regions 26. Meanwhile, gate polysilicon 16 and amorphous silicon spacer 24 are also annealed, and thus doped regions 16a and 24a are respectively formed. It is noted that forming doped regions 16a and 24a is necessary and critical for the present invention. The purpose of doped regions 16a and 24a is to "seal" the air gap in the sidewall spacer, which will be described in detail later.

Step 6

Figure 7:
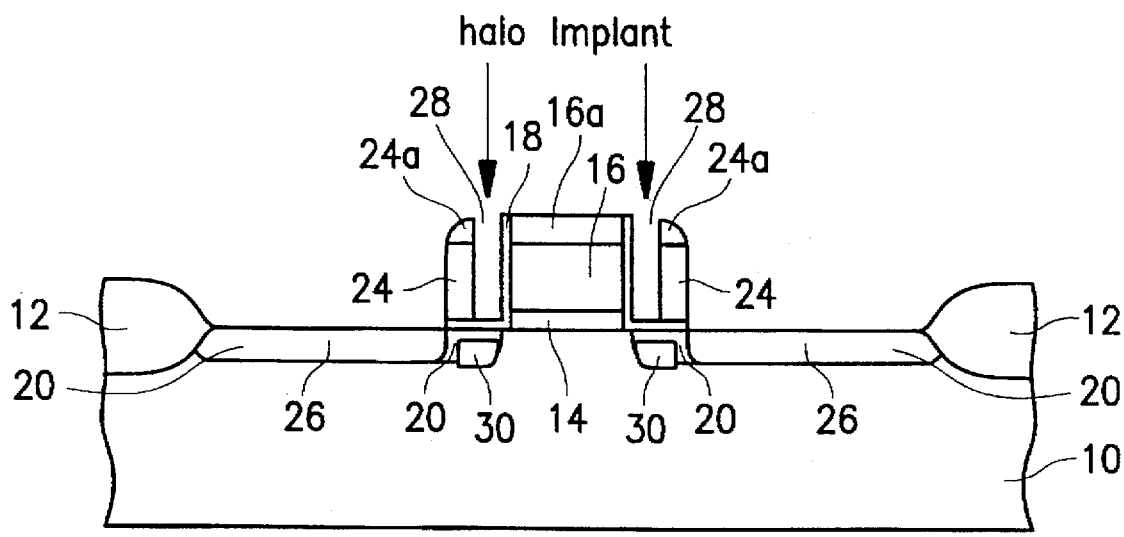

Referring to FIG. 7, the sixth step of this embodiment is to remove nitride spacer 22. Nitride spacer 22 may be removed by wet etching or dry etching, which has a high selectivity with respect to doped silicon material (including doped polysilicon and amorphous silicon). After removing nitride spacer 22, hole 28 located between the gate structure and amorphous silicon spacer 24 is present. At this time, an optional halo implant is applied on substrate 10 through hole 28, and thus halo regions 30, which prevents punchthrough effects, are formed beneath lightly doped regions 20. For NMOS devices, this implant may use BF$_2$ or B as dopants, with a dosage of between $5\times10^{11}$ and $5\times10^{13}$ atoms/cm$^2$ and an energy of between 20 KeV and 100 KeV.

Step 7

Figure 8:
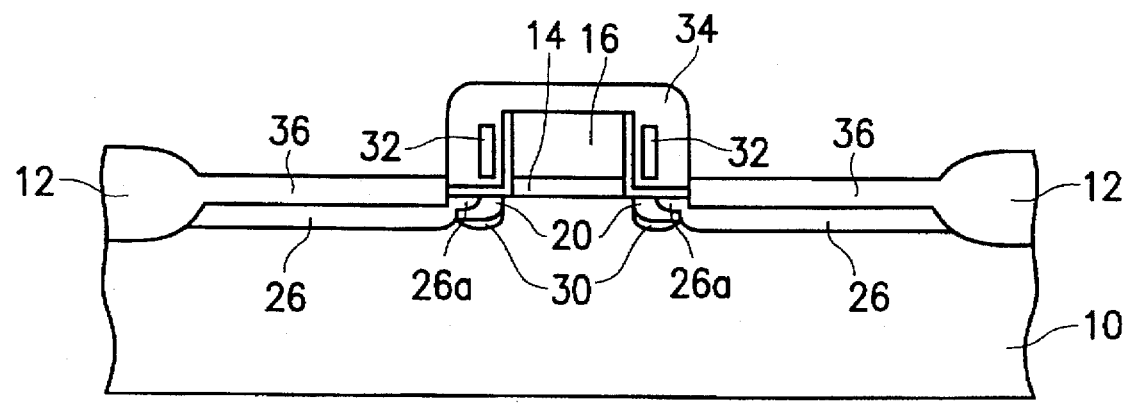

Referring to FIG. 8, the last step of this embodiment is to complete a NMOS device having a gate-side air-gap structure. In this step, amorphous silicon spacer 24 is oxidized by a low temperature oxidation process, and, thus, doped oxide spacer 34 enclosing the gate structure and oxide layer 36 covering heavily doped drain/source regions are formed.

In this step, there are two phenomena should be noted. The first phenomenon is that heavily doped regions 24a of amorphous silicon spacer 24 has a higher oxidation rate than that of other portions, and, therefore, during the oxidation process, growing oxide spacer 34 will seal hole 28 and air gap 32 is enclosed within oxide spacer 34. As a result, the fringing field capacitance of the MOS device can be reduced due to the gate-side air-gap structure. This effect achieves the objective of the present invention.

In addition, the second phenomenon is that the dopants implanted into doped amorphous silicon spacer 24a may migrate into substrate 10 through oxynitride 18 during the thermal oxidation process, and thus extended ultra-shallow source/drain regions 26a are formed beneath doped oxide spacer 34 and embedded in substrate 10. These extended ultra-shallow source/drain regions 26a can reduce series resistance of the LDD structure, which includes lightly doped regions 20 and heavily doped regions 26.

After forming doped oxide spacer 34, the MOS device having a gate-side air-gap structure is completed. Other subsequent processes, such as metalization, passivation and bonding, are the same as that for conventional processes and will not be further described.

The foregoing description of preferred embodiments of the present invention has been provided for the purposes of illustration and description. It is not intended to be exhaustive or to limit the invention to the precise forms disclosed. The embodiments described were chosen to best explain the principles of the invention and its practical application. Others skilled in the art can implement the invention in various other embodiments and with various other modifications as are suited to the particular use contemplated. It is intended that the scope of the invention be defined by the following claims and their equivalents.

What is claimed is:

1. A method for fabricating a NOS device having a gate-side air-gap structure, comprising:

patterning a polysilicon gate structure on a semiconductor substrate;

applying a first ion implantation into the semiconductor substrate to form a lightly doped source region and a lightly doped drain region embedded in the semiconductor substrate on opposite sides of the polysilicon gate structure;

forming a nitride spacer adjacent to the polysilicon gate structure on the semiconductor substrate;

forming an amorphous silicon spacer adjacent to the nitride spacer on the semiconductor substrate;

applying a second ion implantation into the semiconductor substrate, the polysilicon gate structure and the amorphous silicon spacer;

annealing the semiconductor substrate to form a heavily doped source region and a heavily doped drain region embedded in the semiconductor substrate;

removing the nitride spacer; and oxidizing the amorphous silicon spacer by a wet oxidation process to form a doped oxide spacer with an air gap and extended doped regions embedded in the semiconductor substrate beneath the doped oxide spacer.

2. The method of claim 1 wherein after the step of patterning the polysilicon gate structure includes a step of oxidizing the surface of the exposed semiconductor substrate and the polysilicon gate structure in an $N_2O$ gas ambient to form an oxynitride film thereon.

3. The method of claim 1 wherein after the step of removing the nitride spacer further comprising a step of applying a halo ion implantation through the removed position to form halo regions beneath the lightly doped source and drain regions.

4. The method of claim 1 wherein the step of forming the nitride spacer includes:

depositing a nitride layer on the polysilicon gate structure and the semiconductor substrate; and anisotropically etching the nitride layer to remove a portion of the nitride layer on the semiconductor substrate and to form the nitride spacer adjacent to the polysilicon gate structure.

5. The method of claim 4 wherein the nitride layer has a thickness of between 200 Å and 1000 Å.

6. The method of claim 1 wherein the step of forming the amorphous silicon layer includes:

depositing an amorphous silicon layer on the polysilicon gate structure, the nitride spacer and the semiconductor substrate; and anisotropically etching the amorphous silicon layer to form the amorphous silicon spacer adjacent to the polysilicon gate structure.

7. The method of claim 6 wherein the amorphous silicon layer has a thickness of between 200 Å and 1000 Å.

8. The method of claim 1, wherein the second ion implantation has a higher implant dosage than that of the first ion implantation.

9. A method for fabricating a MOS device having a gate-side air-gap structure, comprising:

patterning a polysilicon gate on a semiconductor substrate, the polysilicon gate having a stacked structure of a gate polysilicon layer and a gate oxide layer;

oxidizing the surface of the exposed semiconductor substrate and the polysilicon gate in an $N_2O$ gas ambient to form an oxynitride film thereon;

applying a first ion implantation on the semiconductor substrate to form a lightly doped source region and a lightly doped drain region embedded in the semiconductor substrate on opposite sides of the polysilicon gate structure;

forming a nitride spacer adjacent to the polysilicon gate structure on the semiconductor substrate;

forming an amorphous silicon spacer adjacent to the nitride spacer on the semiconductor substrate;

applying a second ion implantation on the semiconductor substrate, the polysilicon gate structure and the amorphous silicon spacer;

annealing the semiconductor substrate to form a heavily doped source region and a heavily doped drain region embedded in the semiconductor substrate;

removing the nitride spacer;

applying a third ion implantation to form halo regions beneath the lightly doped source and drain regions; and oxidizing the amorphous silicon spacer by a wet oxidation process to form a doped oxide spacer with an air gap and extended doped regions embedded in the semiconductor substrate beneath the doped oxide spacer.

10. The method of claim 9, wherein the second ion implantation has a higher implant dosage than that of the first ion implantation.

11. The method of claim 9 wherein the step of forming the nitride spacer includes:

depositing a nitride layer on the polysilicon gate structure and the semiconductor substrate; and anisotropically etching the nitride layer to remove the portion of the nitride layer on the semiconductor substrate and to form the nitride spacer adjacent to the polysilicon gate structure.

12. The method of claim 11 wherein the nitride layer has a thickness of between 200 Å and 1000 Å.

13. The method of claim 9 wherein the step of forming the amorphous silicon layer includes:

depositing an amorphous silicon layer on the polysilicon gate structure, the nitride spacer and the semiconductor substrate; and anisotropically etching the amorphous silicon layer to form the amorphous silicon spacer adjacent to the polysilicon gate structure.

14. The method of claim 13 wherein the amorphous silicon layer has a thickness of between 200 Å and 1000 Å.

* * * * *